(12) United States Patent
Doogue et al.

(10) Patent No.: US 8,604,777 B2
(45) Date of Patent: Dec. 10, 2013

(54) CURRENT SENSOR WITH CALIBRATION FOR A CURRENT DIVIDER CONFIGURATION

(75) Inventors: Michael C. Doogue, Manchester, NH (US); Shaun D. Milano, Concord, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 287 days.

(21) Appl. No.: 13/181,926

(22) Filed: Jul. 13, 2011

(65) Prior Publication Data

US 2013/0015843 A1  Jan. 17, 2013

(51) Int. Cl.
  *G01R 35/00*  (2006.01)
(52) U.S. Cl.
  USPC ....... 324/202; 324/130; 324/126; 324/117 H; 324/117 R; 324/219; 73/514.16; 73/514.31; 361/93.6; 323/277
(58) Field of Classification Search
  USPC ......................................................... 324/202
  See application file for complete search history.

(56) References Cited

U.S. PATENT DOCUMENTS

| | | | |
|---|---|---|---|
| 4,236,832 A | 12/1980 | Komatsu et al. | |
| 4,438,347 A | 3/1984 | Gehring | |
| 4,752,733 A | 6/1988 | Petr et al. | |
| 4,760,285 A | 7/1988 | Nelson | |
| 4,823,075 A | 4/1989 | Alley | |
| 4,833,406 A | 5/1989 | Foster | |
| 4,970,411 A | 11/1990 | Halg et al. | |
| 5,066,904 A | * 11/1991 | Bullock | 324/127 |
| 5,247,278 A | 9/1993 | Pant et al. | |

(Continued)

FOREIGN PATENT DOCUMENTS

| | | |
|---|---|---|
| DE | 195 39 458 A1 | 4/1997 |
| EP | 0289414 A2 | 11/1988 |

(Continued)

OTHER PUBLICATIONS

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.

(Continued)

*Primary Examiner* — Jermele M Hollington
*Assistant Examiner* — Thang Le
(74) *Attorney, Agent, or Firm* — Daly, Crowley, Mofford & Durkee, LLP (57) ABSTRACT

An integrated circuit (IC) current sensor that self-calibrates to adjust its signal gain when employed in a current divider configuration is presented. The current sensor includes an integrated current conductor, a magnetic field transducer, a controllable gain stage and a calibration controller. The integrated current conductor is adapted to receive a portion of a calibration current. The calibration current corresponds to a full scale current. The magnetic field transducer, responsive to the calibration current portion, provides a magnetic field signal having a magnitude proportional to a magnetic field generated by the calibration current portion. The controllable gain stage is configured to amplify the magnetic field signal with an adjustable gain to provide an amplified magnetic field signal. The calibration controller is responsive to a calibration command signal to adjust the adjustable gain of the controllable gain stage to a calibrated gain in order to provide the amplified magnetic field signal at a predetermined voltage level that corresponds to a desired current sensor output signal voltage level if the full scale current were received by the integrated current conductor.

20 Claims, 8 Drawing Sheets

(56) References Cited

U.S. PATENT DOCUMENTS

| | | | |
|---|---|---|---|
| 5,329,416 A | 7/1994 | Ushiyama et al. | |
| 5,412,255 A | 5/1995 | Wallrafen | |
| 5,469,058 A | 11/1995 | Dunnam | |
| 5,477,135 A | 12/1995 | Baker | |
| 5,493,211 A * | 2/1996 | Baker | 324/130 |
| 5,521,501 A | 5/1996 | Dettmann et al. | |
| 5,621,319 A | 4/1997 | Bilotti et al. | |
| 5,640,090 A | 6/1997 | Furuya et al. | |
| 5,646,578 A * | 7/1997 | Loh et al. | 330/279 |
| 6,436,748 B1 | 8/2002 | Forbes et al. | |
| 6,437,558 B2 | 8/2002 | Li et al. | |
| 6,781,359 B2 | 8/2004 | Stauth et al. | |
| 6,853,178 B2 | 2/2005 | Hayat-Dawoodi | |
| 6,896,407 B2 | 5/2005 | Nomiyama et al. | |
| 6,995,315 B2 | 2/2006 | Sharma et al. | |
| 7,038,448 B2 | 5/2006 | Schott et al. | |
| 7,075,287 B1 | 7/2006 | Mangtani et al. | |
| 7,166,807 B2 | 1/2007 | Gagnon et al. | |
| 7,259,545 B2 | 8/2007 | Stauth et al. | |
| 7,265,531 B2 | 9/2007 | Stauth et al. | |
| 7,474,093 B2 | 1/2009 | Ausserlechner | |
| 7,476,816 B2 | 1/2009 | Doogue et al. | |
| 7,518,354 B2 | 4/2009 | Stauth et al. | |
| 7,598,601 B2 | 10/2009 | Taylor et al. | |
| 7,709,754 B2 | 5/2010 | Doogue et al. | |
| 7,746,056 B2 * | 6/2010 | Stauth et al. | 324/117 R |
| 7,923,996 B2 | 4/2011 | Doogue et al. | |
| 8,030,918 B2 | 10/2011 | Doogue et al. | |
| 8,358,166 B2 * | 1/2013 | Meyer | 327/348 |
| 2006/0202692 A1 | 9/2006 | Tatschl et al. | |
| 2007/0188946 A1* | 8/2007 | Shoji | 360/324.12 |
| 2007/0210864 A1* | 9/2007 | Hirabayashi et al. | 330/86 |
| 2007/0247141 A1* | 10/2007 | Pastre et al. | 324/202 |
| 2007/0279053 A1 | 12/2007 | Taylor et al. | |
| 2008/0009255 A1* | 1/2008 | Tan et al. | 455/234.1 |
| 2009/0001964 A1 | 1/2009 | Strzalkowski | |
| 2009/0009156 A1* | 1/2009 | Duric | 324/202 |
| 2009/0058412 A1 | 3/2009 | Taylor et al. | |
| 2009/0085706 A1 | 4/2009 | Baarman et al. | |
| 2009/0224716 A1* | 9/2009 | Vig et al. | 318/550 |
| 2009/0284248 A1* | 11/2009 | Etter et al. | 324/126 |
| 2010/0211347 A1 | 8/2010 | Friedrich et al. | |

FOREIGN PATENT DOCUMENTS

| | | | |
|---|---|---|---|
| EP | 0289414 A3 | 11/1988 | |
| EP | 0357013 A2 | 3/1990 | |
| EP | 0357013 A3 | 3/1990 | |
| EP | 0 877 232 A2 | 11/1998 | |
| EP | 0 877 232 A3 | 11/1999 | |
| EP | 1637898 A1 | 3/2006 | |
| EP | 1679524 A1 | 7/2006 | |
| EP | 1850143 A1 | 10/2007 | |
| GB | 2276727 A | 10/1994 | |
| JP | SHO 61-48777 | 3/1986 | |
| JP | 2006-190140 | 7/2006 | |
| WO | WO 9602849 A1 | 2/1996 | |
| WO | WO 2004/072672 | 8/2004 | |
| WO | WO 2006/056829 | 6/2006 | |
| WO | WO 2007/138508 A1 | 12/2007 | |
| WO | WO 2008/048379 A1 | 4/2008 | |
| WO | WO 2009/108422 A2 | 9/2009 | |
| WO | WO 2009/108422 A3 | 9/2009 | |
| WO | WO 2010/096367 A1 | 8/2010 | |

OTHER PUBLICATIONS

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.

Ausserlechner et al.; "Limits of Offset Cancellation by the Principle of Spinning Current Hall Probe;" Proceedings of IEEE Sensors; Oct. 2004; pp. 1117-1120.

Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.

Bahreyni, et al.; "A Resonant Micromachined Magnetic Field Sensor;" IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.

Baschirotto et al.; "Development and Analysis of PCB Vector 2-D Magnetic Field Sensor System for Electronic Compass;" IEEE Sensors Journal vol. 6, No. 2; Apr. 2006; pp. 365-371.

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.

Demierre, et al.; "Reference Magnetic Actuator for Self-Calibration of a Very Small Hall Sensor Array;" Sensors and Actuators A97-98; Apr. 2002; pp. 39-46.

Frick, et al.; "CMOS Microsystem for AC Current Measurement with Galvanic Isolation;" IEEE Sensors Journal; vol. 3, No. 6; Dec. 2003; pp. 752-760.

Halg; "Piezo-Hall Coefficients of n-Type Silicon;" Journal of Applied Physics; vol. 64, No. 1; Jul. 1, 1988; pp. 276-282.

Hosticka; "CMOS Sensor Systems;" Sensors and Actuators A66; Apr. 1998; pp. 335-341.

Kanda et al.; "The Piezo-Hall Effect in n-Silicon;" $22^{nd}$ International Conference on the Physics of Semiconductors; vol. 1, Jan. 1995; pp. 89-92.

Krammerer et al.: "A Hall effect sensors network insensitive to mechanical stress;" Proceedings of IEEE Sensors; vol. 3, Oct. 2004; pp. 1071-1074.

Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.

Manic et al.; "Short and Long-Term Stability Problems of Hall Plates in Plastic Packages;" IEEE $38^{th}$ Annual International Reliability Physics Symposium; Apr. 2000; pp. 225-230.

Manic; "Drift in Silicon Integrated Sensors and Circuits Due to the Thermo-Mechanical Stresses;" Lausanne, École Polytechnique Fédérale De Lausanne 2000; Part 1 of 2; 74 pages.

Manic; "Drift in Silicon Integrated Sensors and Circuits Due to the Thermo-Mechanical Stresses;" Lausanne, École Polytechnique Fédérale De Lausanne 2000; Part 2 of 2; 102 pages.

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.

Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Munter; "A Low-offset Spinning-current Hall Plate;" Sensors and Actuators A21-A23; 1990; pp. 742-746.

Munter; "Electronic Circuitry for a Smart Spinning-current Hall Plate with Low Offset;" Sensors and Actuators A; Jun. 1991;.pp. 747-751.

Partin et al.; "Temperature Stable Hall Effect Sensors;" IEEE Sensors Journal, vol. 6, No. 1; Feb. 2006; pp. 106-110.

Pastre, et al.; "A Hall Sensor Analog Front End for Current Measurement with Continuous Gain Calibration;" IEEE Sensors Journal; vol. 7, No. 5; May 2007; pp. 860-867.

Pastre, et al.; "A Hall Sensor-Based Current Measurement Microsystem With Continuous Gain Calibration;" Research in Microelectronics and Electronics, IEEE vol. 2; Jul. 25; 2005; ISBN: 0-7803-9345-7; pp. 95-98.

PCT International Preliminary Report on Patentability and Written Opinion mailed Sep. 10, 2010 for PCT/US2009/031776.

PCT Search Report and Written Opinion of the ISA for PCT/US2009/031776 dated Oct. 23, 2009.

(56) References Cited

OTHER PUBLICATIONS

PCT Search Report and Written Opinion of the ISA for PCT/US2010/024256 dated Aug. 11, 2010.
Popovic; "Sensor Microsystems;" Proc. $20^{th}$ International Conference on Microelectronics (MWIL 95); vol. 2, NIS, Serbia, 12-14; Sep. 1995; pp. 531-537.
Preliminary Amendment filed on Oct. 5, 2010 for U.S. Appl. No. 12/706,318.
Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping;" $5^{th}$ IEEE Conference on Sensors, Oct. 2007; pp. 1131-1134.
Ruther et al.; "Theromagnetic Residual Offset in Integrated Hall Plates;" IEEE Sensors Journal; vol. 3, No. 6; Dec. 2003; pp. 693-699.
Schneider, et al.; "Temperature Calibration of CMOS Magnetic Vector Probe for Contactless Angle Measurement System;" IEDM; Dec. 1996; pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" $8^{th}$ International Conference on Solid-State Sensors and Actuators; vol. 2; Jun. 25, 1995; pp. 237-240.
Steiner et al.; "Double-Hall Sensor with Self-Compensated Offset;" International Electron Devices Meeting; Dec. 7, 1997; ISBN: 0-7803-4100-7; pp. 911-914.
Steiner et al; Offset Reduction in Hall Devices by Continuous Spinning Current Method; Sensors and Actuators A66; 1998; pp. 167-172.
Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.
Trontelj et al; "CMOS Integrated Magnetic Field Source Used as a Reference in Magnetic Field Sensors on Common Substrate;" WEP 1-6; IMTC; May 1994; pp. 461-463.
Zou et al.; "Three-Dimensional Die Surface Stress Measurements in Delaminated and Non-Delaminated Plastic Packages;" 48th Electronic Components and Technology Conference; May 25, 1998; pp. 1223-1234.
Dickinson et al.; "Using Allegro Current Sensor ICs in Current Divider Configurations for Extended Measurement Range", Allegro Product Information, 2005, 11 pages.
U.S. Appl. No. 12/037,393, filed Feb. 26, 2008.
U.S. Appl. No. 12/959,672, filed Dec. 3, 2010.
Notification of Transmittal of the International Search Report and The Written Opinion or the International Searching Authority, or the Declaration, PCT/US2012/045368, dated Oct. 29, 2012, 1 page.
International Search Report, PCT/US2012/045368, dated Oct. 29, 2012, 5 pages.
Written Opinion of the International Searching Authority, PCT/US2012/045368, dated Oct. 29, 2012, 8 pages.
ACS712 Datasheet, "Fully Integrated, Hall Effect-Based Linear Current Sensor IC with 2.1 k VRMS Isolation and a Low-Resistance Current Conductor," Allegro Microsystems, Inc., 2006, 14 pages.
Mike Cable, CALIBRATION: A Technician's Guide, Chapter 1—"Calibration Principles," Technician Series, ISA, 2005, pp. 1-10.
ACS758xCB Datasheet, "Thermally Enhanced, Fully Integrated, Hall Effect-Based Linear Current Sensor IC with 100 μΩ Current Conductor," Allegro Microsystems, Inc., 2008, 21 pages.
Notice of Allowance; dated Feb. 11, 2011; for U.S. Appl. No. 12/037,393; 6 pages.
Office Action; dated Feb. 2, 2011; for U.S. Appl. No. 12/959.672; 13 pages.
Letter from NTD Patent & Trademark Agency Limited; dated Oct. 10, 2012; for Chinese Pat. App. No. 200980106535.4; 13 pages.
Chinese Office Action; dated Aug. 29, 2012; for Chinese Pat. App. No. 200980106535.4; 4 pages.
Chinese Office Action (Translated into English); dated Aug. 29, 2012; for Chinese Pat. App. No. 200980106535.4; 4 pages.
Letter to Letter to NTD Patent & Trademark Agency Limited; dated Dec. 11, 2012; for Chinese Pat. App. No. 200980106535.4; 3 pages.
Letter from NTD Patent & Trademark Agency Limited; dated Jan. 19, 2013; for Chinese Pat. App. No. 200980106535.4; 1 page.
Response to Chinese Office Action; received Jan. 19, 2013; for Chinese Pat. App. No. 200980106535.4; 12 pages.
Letter from NTD Patent & Trademark Agency Limited; dated May 21, 2013; for Chinese Pat. App. No. 200980106535.4; 4 pages.
Chinese Office Action; dated Apr 15, 2013; for Chinese Pat. App. No. 200980106535.4; 4 pages.
Chinese Office Action (Translated into English); dated Apr 15, 2013; for Chinese Pat. App. No.200980106535.4; 5 pages.
Letter to NTD Patent & Trademark Agency Limited; dated Jun. 19. 2013; for Chinese Pat. App. No. 200980106535.4; 11 pages.
Letter from NTD Patent & Trademark Agency Limited; dated Jul. 11, 2013; for Chinese Pat. App. No. 200980106535.4; 1 page.
Response to Chinese Office Action; received Jul. 11, 2013; for Chinese Pat. App. No. 200980106535.4; 12 pages.
Letter from Yuasa and Hara; dated May 27, 2013; for Japanese Pat. App. No. 2010-547666; 2 pages.
Japanese Notice of Reasons for Rejection; dated Apr. 4, 2013; for Japanese Pat. App. No. 2010-547666; 4 pages.

* cited by examiner

CURRENT SENSOR WITH CALIBRATION FOR A CURRENT DIVIDER CONFIGURATION

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to current sensors with integrated current conductors and, more particularly, to such a current sensor for use in a current divider configuration.

BACKGROUND OF THE INVENTION

As is known in the art, one type of conventional current sensor uses a magnetic field transducer (for example a Hall effect or magnetoresistive transducer) in proximity to a current conductor. The magnetic field transducer generates an output signal having a magnitude proportional to the magnetic field induced by a current that flows through the current conductor. Typically, the current sensor also includes circuitry to amplify and condition the output signal of the magnetic field transducer.

The magnetic field transducer and circuitry are sometimes provided as an integrated circuit (IC) in an IC package that also contains a current conductor. Illustrative current sensors of this type are sold under part numbers ACS712 and ACS758xCB by Allegro MicroSystems, Inc. of Worcester, Mass. 01615, the Assignee of the subject application.

Various parameters characterize the performance of current sensors, including sensitivity. Sensitivity is related to the magnitude of a change in output voltage from the Hall effect transducer in response to a sensed current. The sensitivity of a current sensor is related to a variety of factors. One important factor is the physical separation between the Hall effect element and the current conductor.

Integration of the current conductor into an IC package allows for close and precise positioning of the current conductor relative to the magnetic field transducer. However, the amount of current that can be routed through the current conductor is limited by the physical and thermal limitations of the IC package.

One technique for measuring current levels that exceed the current carrying capability of the current sensor is to physically split the current path between the integrated current conductor and an external shunt current conductor that is coupled in parallel with the integrated current conductor. This technique can also be used to increase the current transient survival capability of the current sensor (also referred to as the current sensor's "over-current capability") by diverting some current away from the current sensor. With such a current divider arrangement, only a portion of the total current to be measured is carried by the integrated current conductor and the remainder of the current is carried by the external shunt current conductor. The external shunt current conductor can be implemented with a trace or layer on a printed circuit board (PCB) on which the current sensor is mounted or with a bus bar. Current conductors that are configured as current dividers are designed to achieve a known division of current so that measurement of the current carried by the integrated current conductor can be used to determine the total current.

While this type of arrangement can be used to increase current measurement levels of an application as well as current carrying capability of the current sensor, there are disadvantages. Namely, since less current will flow through the integrated current conductor, the resulting magnetic field signal level (i.e., the resolution) will be lower. Also, manufacturing and assembly tolerances, both at the device and at the board level, result in some variability in the division of current between the integrated current conductor and the shunt current conductor from the designed division of current. For example, the resistance of the current sensor package's lead frame can vary over the course of time due to production tolerances. The manufacturing process of soldering the current sensor package leads to a PCB trace is also very important, as higher solder resistance can cause more current to pass through the shunt conductor and less through the integrated current conductor of the current sensor. The thickness and width of PCB traces can also vary as a function of manufacturing tolerances. Such variability is undesirable since the total current cannot be accurately determined from the measurement of current carried by the integrated current conductor. In applications where accuracy requirements make it necessary to compensate for these variations, some current sensors allow the sensitivity to be programmed after assembly as is described in an Application Note AN295036, Rev. 3, of Allegro MicroSystems, Inc. entitled "Using Allegro Current Sensor ICs in Current Divider Configurations for Extended Measurement Range" (and published at http://www.allegromicro.com/en/Products/Design/an/an295036.pdf), which Application Note is incorporated by reference herein in its entirety.

SUMMARY OF THE INVENTION

In general, in one aspect, the invention is directed to an integrated circuit current sensor that allows for self-calibration in a current divider configuration. The current sensor includes an integrated current conductor, a magnetic field transducer, a controllable gain stage and a calibration controller. The integrated current conductor is adapted to receive a portion of a calibration current. The calibration current corresponds to a full scale current. The magnetic field transducer, responsive to the calibration current portion, provides a magnetic field signal having a magnitude proportional to a magnetic field generated by the calibration current portion. The controllable gain stage is configured to amplify the magnetic field signal with an adjustable gain to provide an amplified magnetic field signal. The calibration controller is responsive to a calibration command signal to adjust the adjustable gain of the controllable gain stage to a calibrated gain in order to provide the amplified magnetic field signal at a predetermined voltage level that corresponds to a desired current sensor output signal voltage level if the full scale current were received by the integrated current conductor.

Embodiments of the invention may include one or more of the following features. The calibration controller can include a comparator having a first input responsive to a full scale reference voltage indicative of the predetermined voltage level, a second input responsive to the amplified magnetic field signal, and an output at which a comparator output signal is provided in a first state when the amplified magnetic field signal is less than the full scale reference voltage and in a second state when the amplified magnetic field signal is greater than the full scale reference voltage. The calibration controller can further include a counter that is responsive to the calibration command signal to start counting, responsive to the comparator output signal to stop counting, and that provides a counter output signal to the controllable gain stage for adjusting the adjustable gain. The full scale reference voltage can be determined by the calibration command signal. The controllable gain stage can include a variable resistor controlled by the counter output signal from the calibration controller. The controllable gain stage can further include an adjustable reference voltage and the calibration controller can be responsive to a calibration command signal for adjusting the reference voltage to provide the amplified magnetic field signal at a predetermined voltage level corresponding to the calibration current when the calibration current is zero amps.

BRIEF DESCRIPTION OF THE DRAWINGS

The foregoing features of the invention, as well as the invention itself, may be more fully understood from the following detailed description of the drawings, in which.

DETAILED DESCRIPTION

Figure 1:
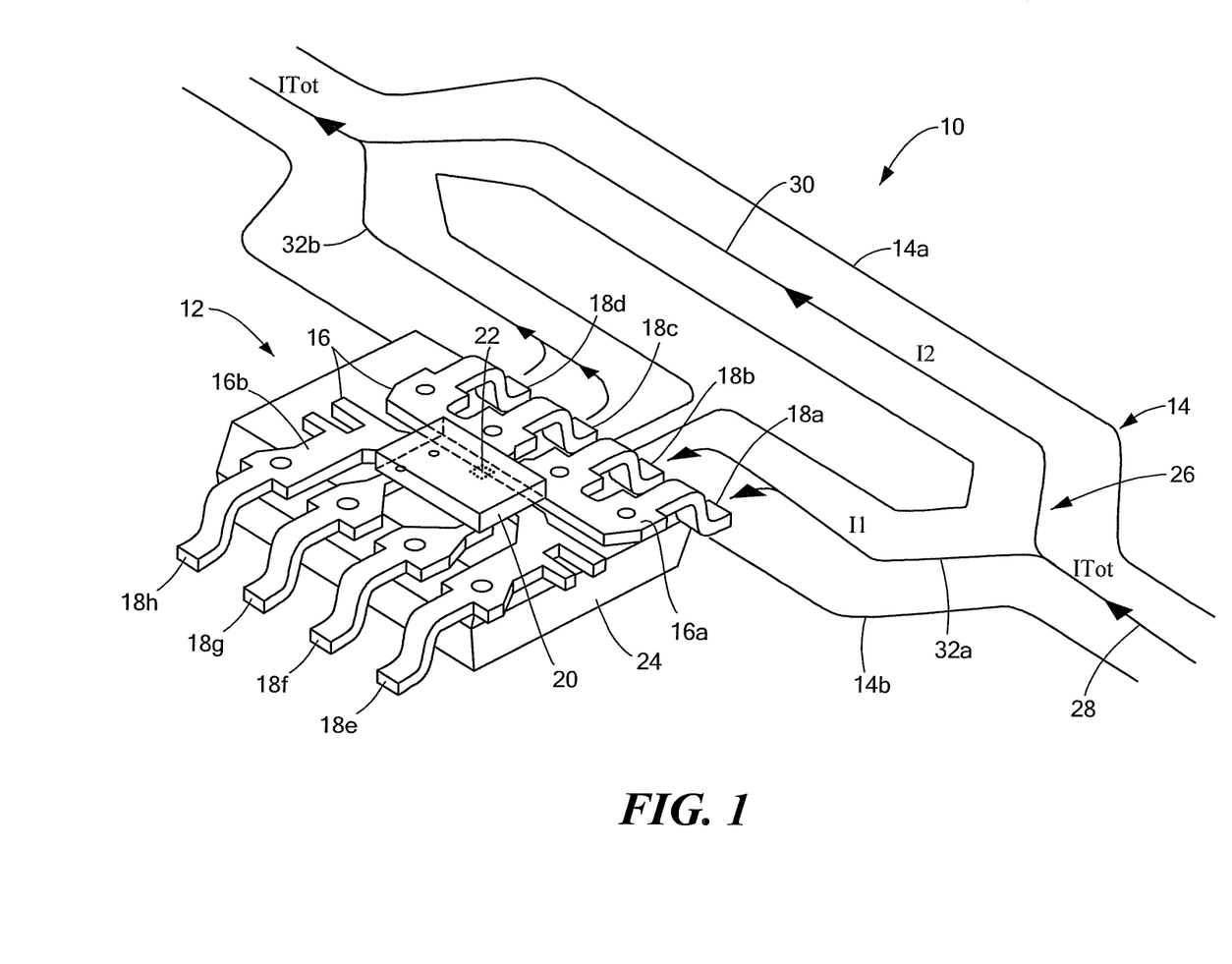
FIG. 1 is a pictorial showing a current sensor in a current divider configuration.

Referring to FIG. 1, an exemplary current divider current sensing configuration 10 includes a current sensor 12 coupled to a current conductor 14. The current conductor may be, for example, a printed circuit board (PCB) trace or layer or a bus bar. In a current divider configuration, as illustrated, the current conductor 14 includes a current sense conductor portion 14a and a shunt conductor portion 14b that are connected in parallel. The figure shows the internal structure of the current sensor 12, which includes a lead frame 16 having a first portion 16a that includes leads (or pins) 18a-18d and a second portion 16b that includes leads 18e-18h. The leads 18a and 18b are coupled to leads 18c and 18d to form an internal current path or conductor. The current sensor 12 also includes an integrated circuit (IC) die 20 having at least one magnetic field transducer or sensing element 22, e.g., a Hall effect element, and interface circuitry (not shown) of a magnetic field sensor provided therein. The die 20 is disposed above the lead frame 16 so that the sensing element 22 is proximate to a "loop" portion of the internal current conductor, the loop portion being located underneath the die 20 (and not shown in the illustrated view the figure). The die 20 is mounted or coupled to the second lead frame portion 16b, and the die and lead frame assembly encased in plastic material 24. The illustrated package style is a surface mount package known as a small outline IC (SOIC).

Figure 7:
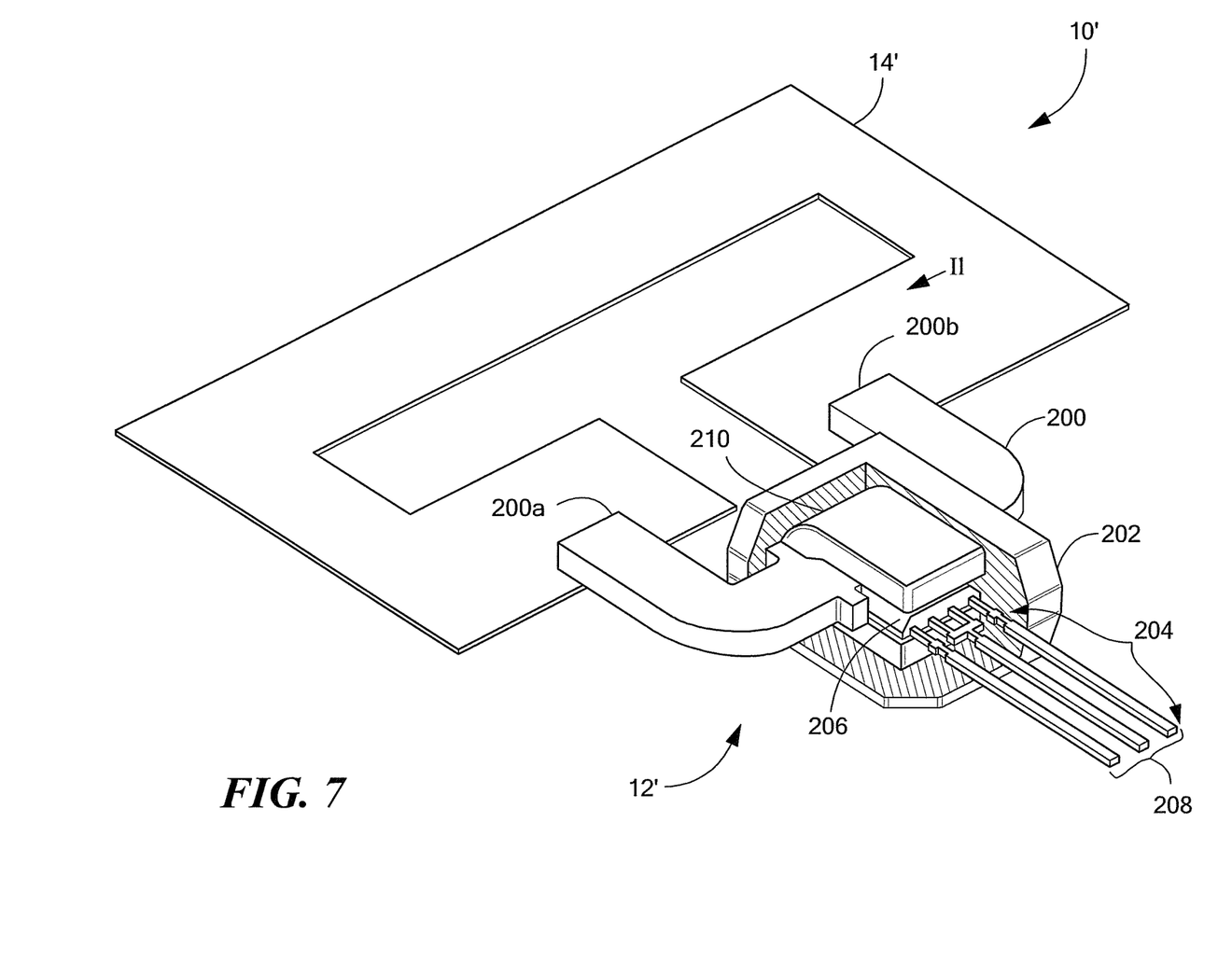
FIG. 7 is a pictorial showing an alternative current sensor in a current divider configuration.

Other package styles that can accommodate some type of internal current conductor along with the die 20 may be used. Another possible package option will be described later with reference to FIG. 7. A current sensor 12 having an integrated current conductor (like that formed between leads 18a, 18b and 18c, 18d) and sensor die (like die 20), regardless of package style, will be referred to herein as an IC current sensor or, simply, a current sensor.

In the current divider configuration, a total current to be measured, labeled "ITot", is applied to the current conductor 14. A current sense portion of the current, labeled "I1", flows through the current sense conductor portion 14a into the leads 18a, 18b, which are shown to be electrically coupled in parallel, through the loop portion (not shown), and out of leads 18c, 18d, which are also electrically coupled in parallel. The remainder of the total current, or shunt current labeled "I2", flows through the shunt conductor portion 14b, thus bypassing the current sensor 12. The path of the current is indicated by reference numeral 26, and includes a total current path 28 for total current ITot, and separate subpaths including a shunt path 30 for shunt current I2 and a current sense path 32a, 32b for current sense current I1.

In this configuration the current to be measured by the current sensor, I1, travels in and out of the current sensor 12 on the primary side. Inside the IC package, the IC die 20 is placed over but does not make contact with the integrated current conductor loop, thereby providing galvanic (voltage) isolation. Although different package technologies can be used, the use of a flip-chip assembly allows the magnetic field transducer 22 of the IC die 20 to be positioned in very close proximity to the internal current conductor loop so that the magnetic signal coupling is maximized.

As noted above in the Background, the disadvantages of using a current divider configuration include loss of current sensor resolution and variability in current division (i.e., mismatch between I1 and I2). Various prior techniques used to address these sources of error include system-level calibration (or compensation) and PCB trace trimming. A system-level calibration involves applying current to a current conductor designed for a desired current division, recording the current sensor's output and scaling that output in an external controller to the desired value. This method requires a more complex control system to be implemented by the user. Alternatively, the PCB trace can be laser trimmed to achieve a desired division of current. The PCB trim method is even more complex than system level calibration and would be time consuming in the application test environment, resulting in a high cost system. As yet another alternative, some current sensors allow device sensitivity to be programmed after device assembly (as mentioned in the above-referenced application note).

In contrast, according to the present invention, the current sensor 12 employs a self-calibration technique. The self-calibration feature allows the current sensor to calibrate itself, more specifically, to adjust sensitivity until the current sensor accurately reflects at its output a value indicative of the total amount current to be measured by an application having a given current divider configuration, that is, ITot. Sensitivity refers to the change in a current sensor's output in response to a change in current being sensed by the device. The sensitivity of the device is the product of the magnetic circuit sensitivity (in G/A) and the current sensor's linear amplifier gain (in mV/G). The sensitivity of the current sensor may be optimized by adjusting the gain. The term "full scale current", as it is used herein, refers to the maximum level of current that would be sensed by the current sensor in absence of a shunt path, that is, the total current ITot. The term "full scale voltage" refers to the output voltage that corresponds to the full scale current. During the self-calibration, as will be described in fuller detail later, the current sensor 12 adjusts gain so that it provides an output signal that is the equivalent of the output signal that would be provided by the current sensor if a shunt path were not utilized, that is, if the current sensor were to sense the full scale current ITot. In this manner, the self-calibration allows for increased current transient survival, i.e., improved over-current capability, on the part of the current sensor (as achieved through the use of a current divider configuration), but unlike prior calibration approaches requires minimal input from the user as well as provides a simpler and less expensive solution to the problems of a shunt system design.

Figure 2:
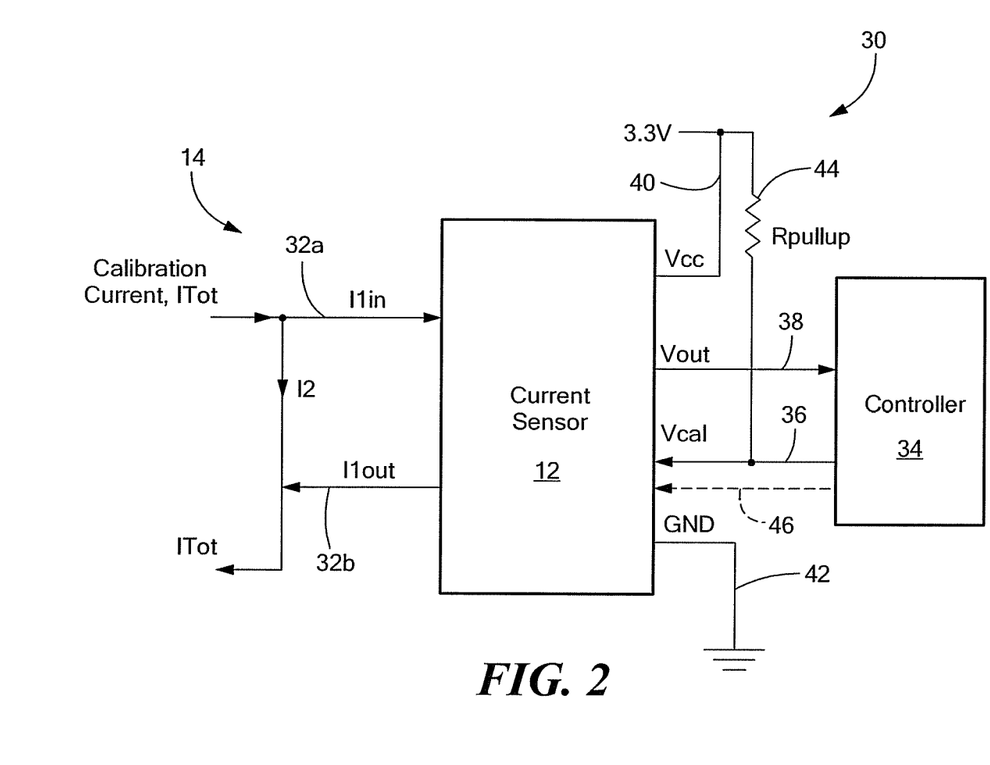
FIG. 2 is a simplified block diagram of the current sensor of FIG. 1 in a control system.

FIG. 2 shows a control system 30 in which a current divider configuration (as depicted in FIG. 1) is provided for calibration. On the primary conductor side of the current sensor 12, the sense current I1 is carried to the current sensor 12 via current input "I1in" 32a and is carried out of the current sensor 12 via output "I1out" 32b. On the secondary side, the current sensor 12 is connected to and controlled by a controller 34. The controller 34 is operated with input from a user. Connections between the controller 34 and current sensor 12 include at least one control line ("Vcal") 36 for sending a calibration command signal to the current sensor 12 and a current sensor output line (Vout) 38 for providing the sensor's output to the controller 34. After self-calibration, during normal operation, the output Vout 38 provides a voltage that is proportional to the total current ITot. Other connections include a supply (Vcc) line 40 connecting the current sensor 12 to a supply voltage shown as 3.3V and a GND line 42 connecting the current sensor 12 to ground. The control line 36 is coupled to Vcc via a pull-up resistor "Rpullup" 44. The current sensor 12, in this arrangement, is operable as a self-calibrating current sensor. The control line 36 is used by the controller 34 to initiate self-calibration on the part of the current sensor 12. In one implementation, as shown, pulling the control line 36 from Vcc to GND (active low) would initiate the calibration sequence. An active high control signal where the control line is normally pulled low and released to a high voltage to initiate calibration could also be used. The user applies a known "calibration" current (as ITot) corresponding to the full scale current, to the current conductor 14, a portion of which will flow into and out of the current sensor 12 as I1, that is, a calibration current sensing portion, and uses the control signal 36 to initiate the self-calibration. During the self-calibration, the current sensor 12 adjusts an internal gain value until the output signal provided at output 38 has a desired value, that is, a level that corresponds to the selected, full scale calibration current ITot.

One or more additional control lines, e.g., line 46 (shown in dashed lines) may be provided for calibration purposes as well. For example, the controller 34 may be configured to use control line 36 to initiate self-calibration, either through the type of signaling described above, or by using a simple serial calibration command, and to use a separate control line, line 46, to set values of certain calibration-required reference voltages to user-selected values, as will be described in further detail later. All of the calibration control could be provided to the current sensor using the same control signal line as well. A single control line like line 36 may be used to control/initiate different "phases" of self-calibration, or separate lines like lines 36 and 46 may be used as dedicated control lines to control/initiate a particular phase, as will be discussed later with reference to FIG. 6.

Figure 3:
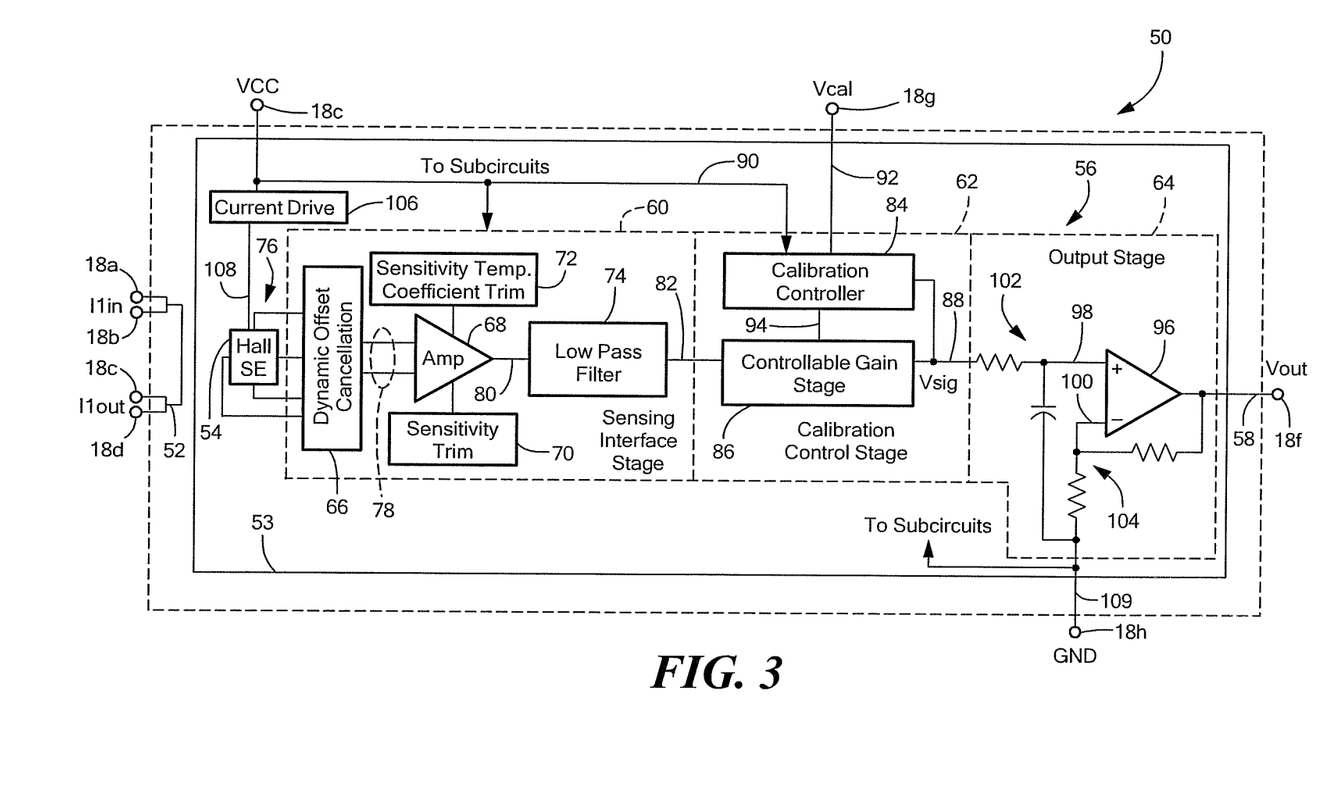
FIG. 3 is a block diagram showing an exemplary architecture of the current sensor of FIGS. 1 and 2.

FIG. 3 shows an internal architecture of the self-calibrating current sensor 12, indicated here by reference numeral 50, according to one exemplary embodiment. Two central components of the architecture are an integrated current conductor 52 and a magnetic field sensor 53. That portion of the current sensor 50 that contains the magnetic field sensor 53 is implemented as a monolithic IC (and thus corresponds to IC die 20 of current sensor 12 from FIGS. 1-2). The magnetic field sensor 53 includes a magnetic field transducer or sensing element shown here as a Hall effect element ("Hall SE") 54 as well as sensor interface circuitry 56. The sensing element 54 senses the magnetic field generated by the current I1 flowing through the current conductor 52. The integrated current conductor 52 may be formed by a portion of the current sensor's lead frame, as was described earlier with reference to FIG. 1.

The circuitry 56 operates to receive an output of the sensing element 54, in this example a Hall voltage, and generate from it a current sensor output 58. For purposes of illustration, the circuitry 56 is partitioned into various functional blocks or stages, including a sensing interface (or magnetic field signal generating) stage 60, a calibration control stage 62 and an output stage 64.

The sensing interface stage 60 can be implemented to include a number of different components to amplify and condition the sensing element's magnetic field signal output. The illustrated architecture includes a dynamic offset cancellation circuit 66, an amplifier 68, trim circuits 70 and 72, and a filter 74 shown as a low pass filter. The dynamic offset cancellation circuit 66, which is coupled to the SE 54 by connections 76, provides a DC offset adjustment for DC voltage errors associated with the magnetic field signal produced by the sensing element 54. The dynamic offset cancellation circuit 66 is coupled to the amplifier 68, which amplifies an offset adjusted SE output signal 78 provided by the dynamic offset cancellation circuit 66. Accuracy is optimized through trimming of sensitivity and temperature response, via the sensitivity trim circuit 70 and sensitivity temperature coefficient trim circuit 72, respectively. The sensitivity trim circuit 70 permits adjustment of the gain of the amplifier 68. The sensitivity temperature coefficient trim circuit 72 permits adjustment of the gain of the amplifier 68 in order to compensate for gain variations due to temperature.

The output of the amplifier 68, or amplifier output 80, is coupled to the filter 74. The filter 74 can be a low pass filter, as shown, and/or a notch filter. The filter 74 is selected in accordance with a variety of factors, including but not limited to, a desired response time and a frequency spectrum of noise associated with the sensing element, the dynamic offset cancellation circuit and the amplifier. The filter produces at its output a filtered, magnetic field output signal 82, which is provided as an input to the calibration control stage 62. Other implementations of the sensing interface stage 60 are possible.

Still referring to FIG. 3, the calibration control stage 62 includes a calibration controller 84 and a controllable gain stage 86. It is the calibration control stage 62 that performs the self-calibration. The controllable gain stage 86 produces an amplified magnetic field output signal (labeled "Vsig") 88, which is provided to output stage 64 and as an input to the calibration controller 84. In addition to Vsig, the calibration controller 84 receives as inputs Vcc via a supply line 90 and a Vcal "calibration command" input 92 (which is connected to the external calibration control signal line 36 from the external controller 34, as shown in FIG. 2). The calibration controller 84 is coupled to and provides a gain adjustment output 94 as an input to the controllable gain stage 86 to adjust an adjustable gain of the controllable gain stage 86, as will be described in further detail in reference to FIGS. 4A-4B. The output of the calibration control stage 86 is coupled to an output stage 64.

The output stage 64 is implemented in the illustrated architecture to provide an analog buffered output. The output stage 64, as depicted, includes a buffer amplifier 96 having a first (non-inverting) input 98 and a second input 100. An RC filter 102 is connected between the first input and the Vsig output 88 from the controllable gain stage 86. Applied to the second input 100 is a reference voltage developed by a resistive voltage divider 104 coupled between Vout 58 and ground.

The magnetic field sensor 53 can be any type of magnetic field sensor and is therefore not limited to Hall effect technology. Thus, the sensing element 54 may take a form other than that of a Hall effect element, such as a magnetoresistance (MR) element. The magnetic field sensor 53 is provided in the form of an IC or die containing a substrate on which the various circuit elements (including the sensing element 54) are formed. Although only one sensing element is shown, that sensing element 54 could be replaced by a pair of sensing elements connected in a differential arrangement, or multiple MR elements connected in a bridge circuit. Components to be included in the stage 60 can vary with the type of sensing technology that is chosen.

The current sensor, in a current divider (or shunt) configuration, as shown in FIGS. 1 and 2, with the self-calibration feature, operates to produce an analog output voltage Vout 58 having a magnitude that is proportional to the magnitude of the total current ITot (not I1 as would be the case without such calibration).

The current sensor 50 will have least one terminal (or pin or lead) to correspond to I1in and I1out, VCC (to connect to an external power supply), GND (to connect to ground), an input and output. For example, and referring back to the SOIC 12 shown in FIG. 1 in conjunction with FIG. 3, the terminals or leads for the current conductor 52 and various signals can be indicated by the reference numerals 18a, 18b for I1in, 18c, 18d for I1out, 18e for Vcc, 18h for GND, 18g for Vcal and 18f for Vout. The current sensor 50 provides the current sensor output signal Vout 58 at the Vout pin 18f for coupling to an external controller (such as controller 34 from FIG. 2) or for transmission to other application electronics (not shown). Power is supplied to the current sensor 50 through the VCC pin 18e, which is connected internally to the various subcircuits via supply bus interconnect 90, as well as a drive circuit 106 which provides a biasing signal to the Hall sensing element 54 via a connection 108. The GND pin 18h is connected internally via a GND bus interconnect 109 to provide a ground connection for subcircuits of the sensor IC. Other circuitry, to implement clock generation and control functions, for example, is largely omitted from this figure and other figures for purposes of simplification.

Figure 4A:
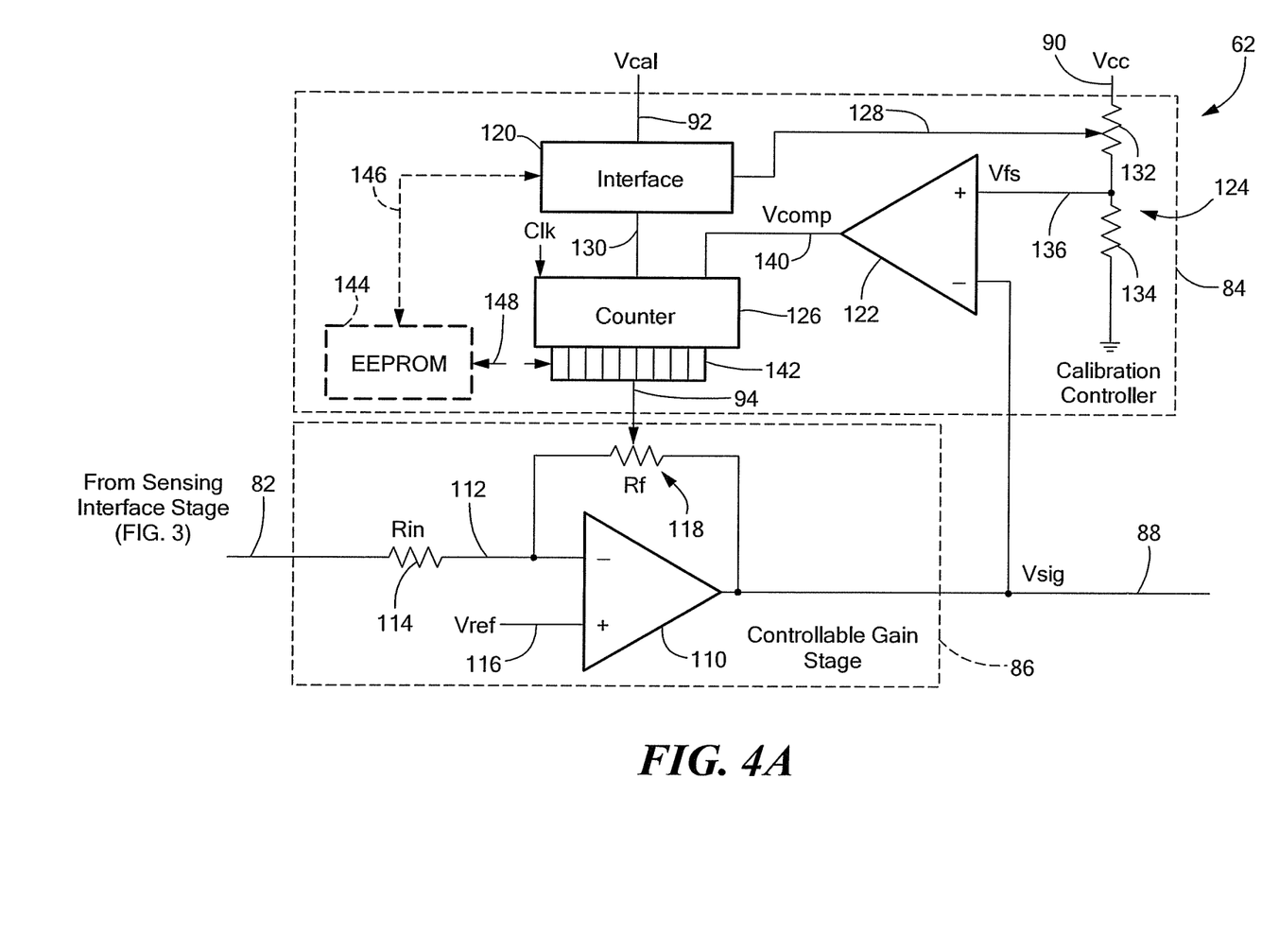
FIG. 4A shows a block diagram of a portion of the current sensor of FIG. 3 including a gain calibration feature, according to an exemplary embodiment.
Figure 4B:
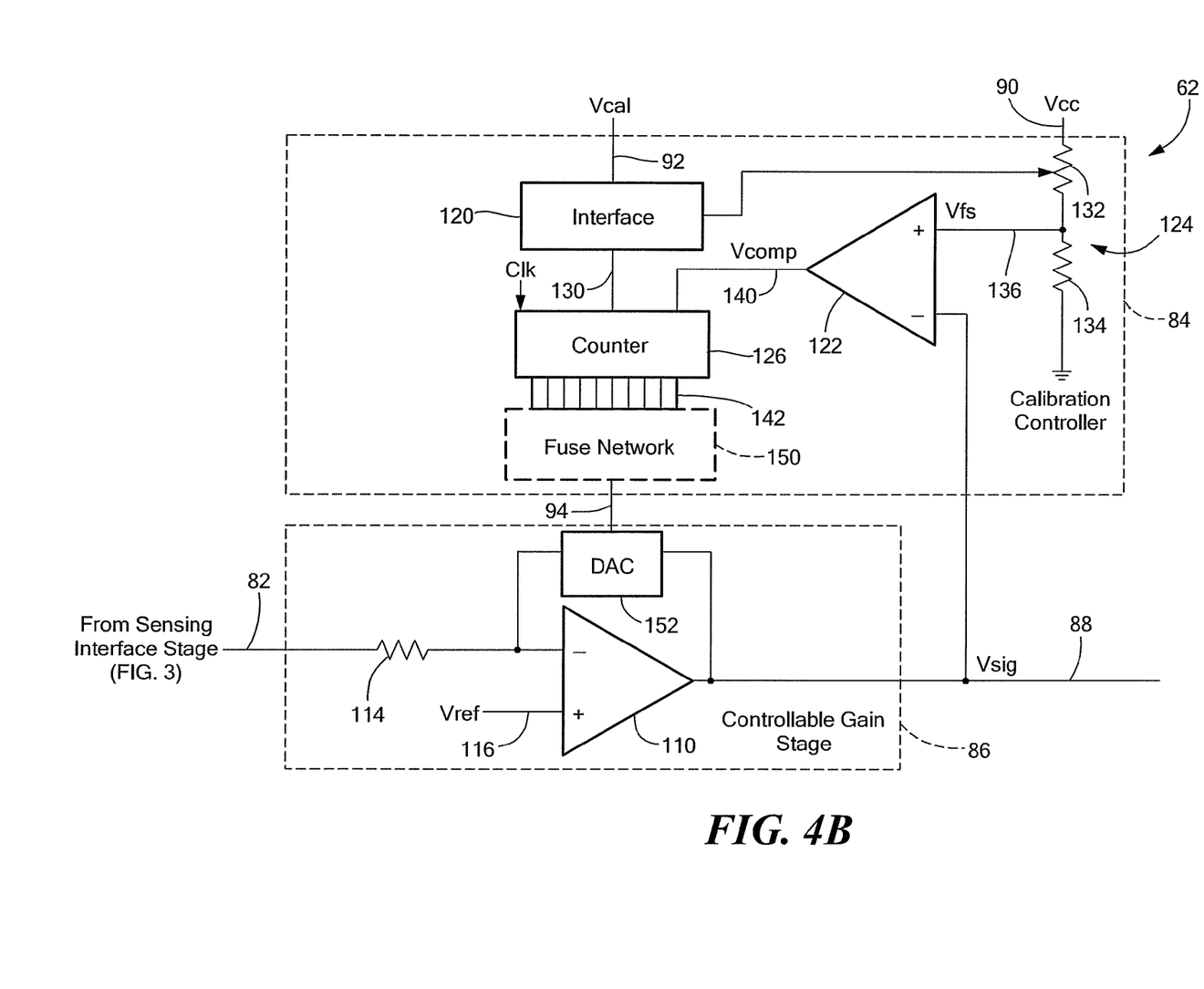
FIG. 4B shows a block diagram of an alternative embodiment of a portion of the current sensor of FIG. 3 including a gain calibration feature.

Details of the calibration control stage 62, in particular, the controllable gain stage 86 and the calibration controller 84, according to an exemplary embodiment, are shown in FIGS. 4A-4B. Referring to FIG. 4A, the controllable gain stage 86 includes an operational amplifier 110 having a first input 112 which couples the output 82 from the previous stage through an input resistor (Rin) 114 to the amplifier 110. The amplifier 110 has a second input 116 corresponding to a reference voltage Vref. A feedback resistor (Rf) 118 is coupled between the first input 112 and the output 88 (Vsig). The value of the feedback resistor 118, a variable resistor, is adjusted by the calibration controller 84 to set the gain of the amplifier 110. The gain or magnetic field signal amplification of amplifier 110 is given by −Rf/Rin. In the illustrated embodiment, the resistor 118 is a digitally-controllable resistor that is controlled by the calibration controller 84 via signal 94.

Still referring to FIG. 4A, the calibration controller 84 includes an interface 120, a comparator 122, a resistive voltage divider 124 and a counter 126. The interface 120 receives as an input the Vcal control signal 92 and provides output signals 128 and 130 to the voltage divider 124 and the counter 126, respectively. The voltage divider 124 includes a first, variable resistor 132 and a fixed value resistor 134. The value of the variable resistor 132 is set by the user and provided via the interface 120 and interface output signal 128 to the voltage divider 124. The voltage divider 124 is used to generate a full scale reference voltage "Vfs", that is provided at a first input to the comparator, first comparator input 136. Through the programming of the resistor 132, therefore, the user is able to specify a desired value for Vfs. The comparator 122 receives the amplified magnetic field signal Vsig 88 (from the output of the amplifier 110, amplifier output 88) as the second input. The comparator's output, comparator output "Vcomp" 140, is provided as a counter input signal to the counter 126. The Vcomp output 140 serves as a counter disable and interface output signal 130 serves as counter enable.

The calibration control signal or command is provided to the calibration controller (via the Vcal line 92) to initiate the self-calibration. Before the self-calibration is initiated, the user causes the desired, full scale calibration current ITot to be applied to the current conductor (current conductor 14 as shown in FIG. 2), which results in a portion of that current, corresponding to I1, flowing into the current sensor's Iin terminal or terminals (e.g., terminals 18a, 18b, as shown in FIG. 3). When the self-calibration has been initiated, the interface 120 signals to the counter 126 via the counter enable input 130 to begin counting. Thus, the counter 126 is enabled to change its internal binary count value corresponding to a gain value, indicated by reference numeral 142. Each count results in an adjustment of the gain of the controllable gain stage 86. More specifically, the gain is adjusted by using the count value to vary the value of the variable feedback resistor 118, which results in a change to Vsig 88. Meanwhile, the comparator 178 compares the signal Vsig 88 with the predetermined reference input Vfs 136. The value of variable resistor 118 is adjusted with each count by the counter 126 until the comparator 122 determines the voltage level of Vsig 88 has passed the full scale threshold value of the full scale reference voltage Vfs 136. Typically, a voltage comparator of the type to be used for comparator 122 changes its output when the voltage difference between its inputs crosses through approximately zero volts. The process of counting, adjusting and comparing continues until the comparator 122 determines that Vsig has reached Vfs, at which point the comparator output Vcomp 140 changes state. More specifically, the comparator output signal Vcomp 140 is provided in a first state when the amplified magnetic field signal Vsig 88 is less than the full scale reference voltage Vfs 136 and in a second state when the amplified magnetic field signal Vsig 88 is greater than the full scale reference voltage Vfs. This change in the state of Vcomp 140 causes the counter 126 to stop counting. The count/gain value corresponding to the final count value is used as the calibrated gain value, to be applied to the controllable gain stage's feedback resistor 118 via counter output 94.

Once the gain adjustment portion of the self-calibration has been completed, the interface 120 can permanently store the calibrated gain value 142 on the chip, e.g., in a nonvolatile memory such as an EEPROM 144, as shown, or in some alternative manner. The EEPROM 144, if used, will be coupled to the interface 122 and count 142 (of the counter 126) via lines 146 and 148, respectively. Once the adjusted gain has been saved, the self-calibration is complete. These interconnections 146 and 148 are used to accomplish a transfer of the calibrated gain value 142 between counter 126 and the nonvolatile memory.

During subsequent, non-calibrating operation of the current sensor in the same current divider configuration with ITot as the total current to flow through the current conductor and I1 the portion to be sensed by the current sensor, the current sensor uses the calibrated gain to provide at the output a signal that has been scaled from a voltage level corresponding to the sensed current to a predetermined voltage level corresponding to the total current ITot.

Certain implementation details of the calibration controller 84 and controllable gain stage 86 are a matter of design choice. For example, as shown in FIG. 4B, the EEPROM or other nonvolatile memory may be replaced with a fuse network 150. Also, the variable resistor 118 may be implemented with any type of digitally controllable variable resistor circuit that allows a range of resistance values to be selectable using a digital code. As shown in FIG. 4B, it could be implemented with a DAC 152, for example, an R/2R ladder DAC, or other type of circuit that provides digital control of variable resistance. It will be understood that the design of the counter and digitally-controllable variable resistor will determine the range and "step" size (i.e., resistance value change per count) of the gain adjustment. Other details of FIG. 4B are as shown in FIG. 4A.

It will be understood that the current sensor 50 could have more input pins so that the calibration command and specification of Vfs (via the adjustment to the voltage divider variable resistor 132) may be provided as separate control signals. The interface 120 can be implemented as a digital serial interface, such as Inter-Integrated Circuit (I$^2$C), Single-Edge Nibble Transmission (SENT), Peripheral Sensor Interface 5 (PSI5) or Serial Peripheral Interface (SPI), or a simple RS232 interface. Thus, for example, the calibration command provided at input 92 and transfer of the count to nonvolatile memory (e.g., EEPROM 144) can be achieved with messages according to a selected one of these or other suitable protocols.

Figure 5:
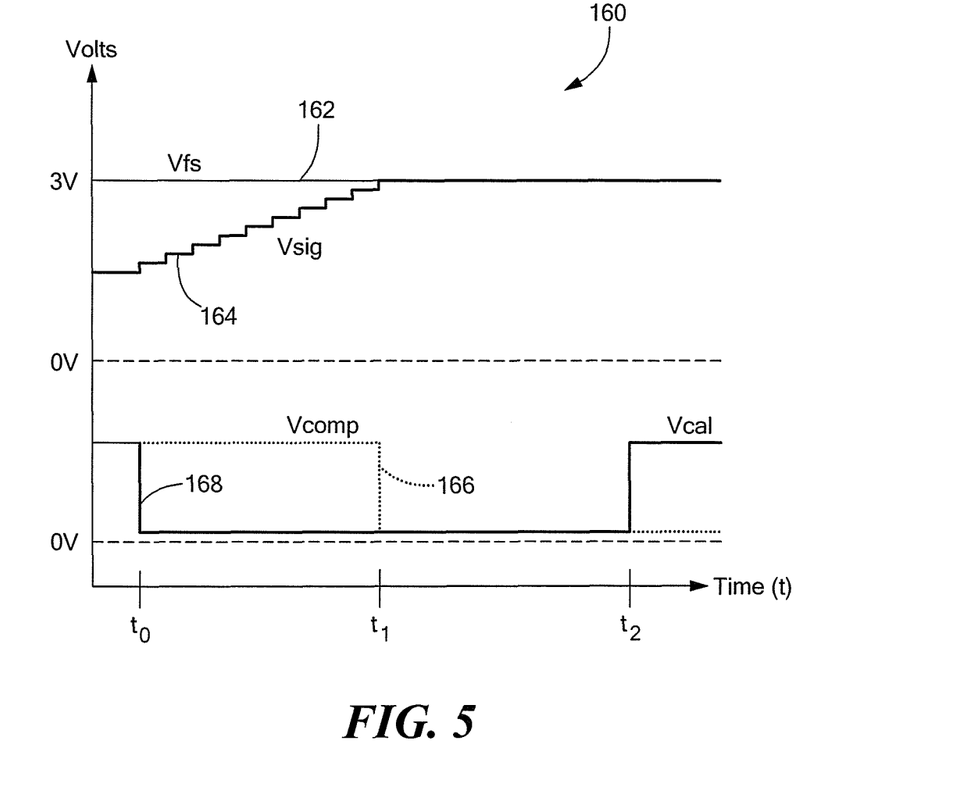
FIG. 5 shows illustrative waveforms associated with the gain calibration feature depicted in FIGS. 4A-4B.

FIG. 5 shows a graph 160 of various calibration-related waveforms, including a waveform 162 corresponding to Vfs, a waveform 164 corresponding to Vsig, a waveform 166 corresponding to Vcomp and a waveform 168 corresponding to Vcal. The Vcomp waveform 166 is indicated in dotted lines to distinguish it from the Vcal waveform 168. At time $t_0$, the Vcal signal (waveform 168) transitions from high to low to initiate the calibration sequence. After the calibration control signal transition, the value of Vsig is being increased as the gain is adjusted with each count. The comparator 122 (from FIGS. 4A-4B) compares Vsig to Vfs. In the illustrated graph, the value of Vfs is shown to be set to a desired value of 3V. The initial value for Vsig is set to VCC/2 (or 1.65V for VCC=3.3V). The value of the gain is adjusted until the value of Vsig is determined to have reached the value of Vfs, which occurs at $t_1$. When Vsig reaches the desired value of Vfs, the comparator output Vcomp changes state (e.g., goes low, as illustrated in the figure). At $t_1$ the gain adjustment portion of the calibration sequence ends. At $t_2$, the control signal Veal goes high again to signal the end of the calibration sequence. Between $t_1$ and $t_2$, the calibration controller 84 (from FIGS. 4A-4B) saves the gain (count) value reached during the gain adjustment, e.g., by storing the value in nonvolatile memory, as discussed earlier.

Thus, for a predetermined voltage level of Vfs and corresponding full scale current level of calibration current (both user-selected levels for a given current divider configuration), the current sensor 50 can self-calibrate to adjust an adjustable gain of the controllable gain stage 86 to scale the value of that stage's output, the amplified magnetic field signal Vsig 88 (and therefore, the output provided at Vout 58 (from FIG. 3)), to the predetermined voltage level of Vfs. For example, assuming that the magnetic circuit sensitivity is in the order of magnitude of approximately 10 Gauss per amp (which means that for every amp flowing through the sensor's integrated current conductor 52, 10 Gauss of field is generated and sensed by the Hall element 54) and that the desired output is 3V when 20 Amps is flowing through the current sensor, then the gain of the controllable gain output stage 62 is calculated to be (3V−1.65V)/20 A/10 G/A or 67.5 mV/A. If a total current, "ITot", of 20 Amps is passed through the current divider system and the current is split perfectly at 10 A through the shunt path ("I2") and 10 A through the sensor ("I1") and the desired output voltage on Vout is 3V, then the gain would be adjusted by the self-calibration to be twice the value calculated above, or (3−1.65)V/10 A/10 G/A, or 135 mV/A.

Adjustable gain values for the 3V output example and different current level splitting are given below in Table 1. The perfect 10 A split between the shunt and current sensor is shown in row 11 of table.

TABLE 1

Current splitting and required gain for a 3 V output

| Row | Amps Total Current | Amps I2 | Amps I1 | mV/A Gain | Volts Vout @ 0 Amps | Volts Vout at I1 |
|---|---|---|---|---|---|---|
| 1 | 20 | 0 | 20 | 68 | 1.65 | 3 |
| 2 | 20 | 1 | 19 | 71 | 1.65 | 3 |
| 3 | 20 | 2 | 18 | 75 | 1.65 | 3 |
| 4 | 20 | 3 | 17 | 79 | 1.65 | 3 |
| 5 | 20 | 4 | 16 | 84 | 1.65 | 3 |
| 6 | 20 | 5 | 15 | 90 | 1.65 | 3 |
| 7 | 20 | 6 | 14 | 96 | 1.65 | 3 |
| 8 | 20 | 7 | 13 | 104 | 1.65 | 3 |
| 9 | 20 | 8 | 12 | 113 | 1.65 | 3 |
| 10 | 20 | 9 | 11 | 123 | 1.65 | 3 |
| 11 | 20 | 10 | 10 | 135 | 1.65 | 3 |
| 12 | 20 | 11 | 9 | 150 | 1.65 | 3 |
| 13 | 20 | 12 | 8 | 169 | 1.65 | 3 |
| 14 | 20 | 13 | 7 | 193 | 1.65 | 3 |
| 15 | 20 | 14 | 6 | 225 | 1.65 | 3 |
| 16 | 20 | 15 | 5 | 270 | 1.65 | 3 |
| 17 | 20 | 16 | 4 | 338 | 1.65 | 3 |
| 18 | 20 | 17 | 3 | 783 | 1.65 | 3 |
| 19 | 20 | 18 | 2 | 1675 | 1.65 | 3 |

In practice, designing a current configuration system that would require that the self-calibration increase the gain to very high levels (e.g., gains above 300 mV/A) is not practical because the Hall transducer output generates a weak signal, which means lower resolution and signal to noise ratio (since both the signal and the noise are amplified as the gain increases). On the other hand, designing the system so that most of the current flows through the current sensor and not the shunt path would do little to improve the over-current capability of the current sensor (which, of course, is one of the advantages of using a shunt path). In the 20 Amp example above, the current sensor could amplify the signal with less than 5 A in the current sensor and greater than 15 A provided through the shunt path for a gain of approximately 300 mV/A as shown in Table 1. This would allow for a split of 5 A/20 A or a 25% to 75% split through the current sensor and shunt path, respectively, while compensating for any error in splitting the current as discussed above.

Normally, when no current is flowing through the current sensor, the value of Vref (at amplifier input 116, FIGS. 4A-4B) is set at a value ("0 amp offset value) that ensures that the zero current output voltage Vsig (referred to as the quiescent voltage output or "QVO", the voltage of the output signal when the current sensed by the sensing element is zero) is at Vcc/2 for bi-directional current sensing (i.e., sensing of current flowing in either direction) or a low voltage near ground, for example, 0.5V, for uni-directional current sensing (i.e., sensing of currents flowing in only in the direction). For example, a bi-directional sensor with a Vcc of 3.3V would have a 0 Amp output of 1.65V.

Figure 6:
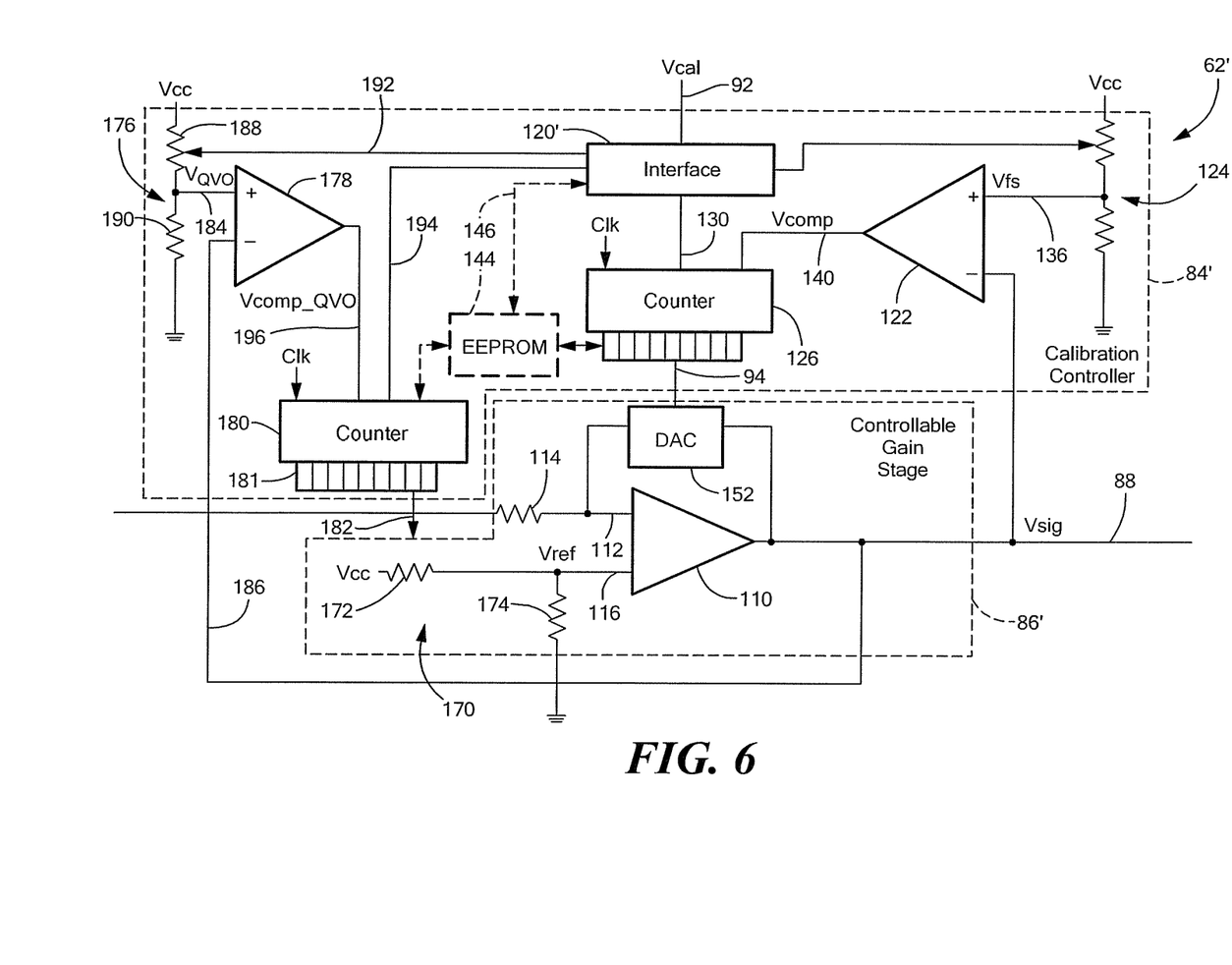
FIG. 6 is a block diagram showing an alternative embodiment of a portion of the current sensor of FIG. 3 including a quiescent voltage output (QVO) calibration feature.

Because QVO often changes as a function of the gain of the current sensor IC, it may be desirable to expand the self-calibration of the calibration control stage 62 to include a second calibration, a QVO calibration, to be performed following the gain adjustment calibration. Referring to FIG. 6, an exemplary embodiment of the calibration control stage 62 that incorporates QVO calibration functionality, calibration control stage 62', is shown. A modified controllable gain stage 86, shown as controllable gain stage 86', further includes a resistive voltage divider 170 formed by a variable resistor 172 and a fixed value resistor 174 to set a value for an adjustable reference voltage Vref at amplifier input 116. A modified calibration controller 84, shown here is calibration controller 84', includes a second resistive voltage divider 176, comparator 178 and counter 180. A count 181 of the counter 180, at counter output 182, is used to set the value of the variable resistor 172 in the controllable gain stage 86'. The comparator 178 has as a first input a voltage $V_{QVO}$ 184 and as a second input the voltage Vsig, fed back from the output of the amplifier 110 in the controllable gain stage 86' via a feedback line 186. The value of $V_{QVO}$ is generated by the voltage divider 176, which is formed by a variable resistor 188 and fixed value resistor 190. The value of the variable resistor 188 is user-programmable via the interface, shown here is interface 120'. The user can therefore specify the $V_{QVO}$ voltage by providing a resistance value to the interface 120' on the Vcal control signal 92 (or separate control signal). The interface 120' provides the resistance value to the variable resistor 188 along line 192. The interface 120' is also coupled to the counter 180 via line 194, which provides a counter enable to the counter 180. Also connected to the counter 180 is the comparator 178, which produces a Vcomp signal ("Vcomp_$_{QVO}$") at 196 to disable the counting by the counter 180.

Once a self-calibration has been initiated, and a gain adjustment portion and calibrated gain store has been completed, the QVO calibration can begin. First the user must set the current ITot through the system to 0 A and then send a second calibration command to the interface 120'. Upon receipt of the calibration command, the interface signals (via line 194) to the counter 180 to start counting. The count of the counter 180 changes and with each count iteration the value of variable resistor 188 is adjusted (thereby adjusting the value of Vref that is provided to the amplifier 110) until the comparator 178 determines that voltage level or magnitude of Vsig has passed the threshold provided by $V_{QVO}$. That is, the comparator output signal 196 is provided in a first state when the magnitude of the amplified magnetic field signal Vsig (provided at 186) is less than that of the $V_{QVO}$ signal 184 and in a second state when the magnitude of the amplified magnetic field signal Vsig is greater than the magnitude of the $V_{QVO}$ signal 184. Once the value of Vsig has reached $V_{QVO}$, the voltage reference adjustment portion of this second phase of the self-calibration is complete and the "final" count value from the counter 180 is saved in the EEPROM 144 or other suitable nonvolatile memory (or, alternately, a fuse network like fuse network 150 shown in FIG. 4B).

The sequencing of these two phases of the self-calibration activity is managed externally through control signals or commands provided by an external controller. A single control line or separate control lines, one to control the gain adjustment and the other to control the offset adjustment, may be used. The self-calibration may be repeated if desired. Also, a QVO calibration could be performed before and after the gain adjustment to provide an initial setting for the adjustable reference voltage and an updated setting following the gain adjustment. The QVO calibration, if performed at least once (following a gain adjustment), would increase the accuracy of the current sensor, especially for designs in which the gain is increased to high levels, e.g., gains above a 300 mV/A level. The QVO calibration could be performed only prior to the gain calibration but with less accurate results (for the reasons discussed above).

To support higher current measurements, another current sensor package option having a thicker current conductor may be used. An example is provided in FIG. 7, which shows the internal structure of a current sensor in a current divider configuration, indicated by reference numeral 10'. The current divider configuration 10' includes a current sensor 12' coupled to the current conductor 14' (depicted as a bus bar). The current sensor 12' includes a primary current conductor 200, a package or housing 202, and a packaged current sensor IC 204. The packaged current sensor IC 204 is shown as a single in-line (SIP) IC with a package body 206 (containing the sensor IC 53 from FIG. 3) and signal pins 208. Because of the magnetic coupling between this thicker current conductor and the IC's sensing element, a flux concentrator 210 is used. The current conductor 200, the SIP device 204 and concentrator 210 are assembled and then overmolded to form the current sensor 12'. Portions of the current conductor 200 that are external to the package 202, that is, portions 200a and 200b, are used to carry the current I1 from the current conductor 14' and through the package 202 containing the assembly of concentrator 210 and SIP 204 and return I1 to the current conductor 14'.

In sum, the current sensor with integrated current conductor and self-calibration as described above can be controlled (with minimal external control) to calibrate itself to have a calibrated gain that results in the current sensor output signal having a voltage level that corresponds to the full scale calibration current, not the sensed portion of the calibration current. In this manner, the self-calibrating current sensor can, with relative ease, compensate for lower signal resolution and "calibrate out" any current mismatch associated with a current divider configuration.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An integrated circuit current sensor, comprising: an integrated current conductor adapted to receive a portion of a calibration current, wherein the calibration current corresponds to a full scale current; a magnetic field transducer responsive to the calibration current portion for providing a magnetic field signal having a voltage level proportional to a magnetic field generated by the calibration current portion; a controllable gain stage configured to amplify the magnetic field signal with an adjustable gain in order to provide an amplified magnetic field signal; and a calibration controller responsive to a calibration command signal from a controller for adjusting the adjustable gain of the controllable gain stage to a calibrated gain to provide the amplified magnetic field signal at a predetermined voltage level that corresponds to a desired current sensor output signal voltage level if the full scale current were received by the integrated current conductor.

2. The integrated circuit current sensor of claim 1 wherein the calibration controller comprises:
a comparator having a first input responsive to a full scale reference voltage indicative of the predetermined voltage level, a second input responsive to the amplified magnetic field signal, and an output at which a comparator output signal is provided in a first state when the amplified magnetic field signal is less than the full scale reference voltage and in a second state when the amplified magnetic field signal is greater than the full scale reference voltage; and
a counter that is responsive to the calibration command signal to start counting, responsive to the comparator output signal to stop counting, and that provides a counter output signal to the controllable gain stage for adjusting the adjustable gain.

3. The integrated circuit current sensor of claim 2 wherein the full scale reference voltage is determined by the calibration command signal.

4. The integrated circuit current sensor of claim 3 wherein the calibration controller further comprises a resistive voltage divider configured to provide the full scale reference voltage, wherein the resistive voltage divider has a variable resistance and a fixed resistance and wherein the variable resistance is determined by the calibration command signal.

5. The integrated circuit current sensor of claim 2 wherein the controllable gain stage comprises a variable resistor controlled by the counter output signal.

6. The integrated circuit current sensor of claim 5 wherein the variable resistor comprises a digital-to-analog converter (DAC).

7. The integrated circuit current sensor of claim 6 wherein the DAC comprises an R/2R DAC.

8. The integrated circuit current sensor of claim 1 wherein the calibration command signal is a serial binary signal in a format selected from Inter-Integrated Circuit (I$^2$C), Single-Edge Nibble Transmission (SENT), Peripheral Sensor Interface 5 (PSI5) or Serial Peripheral Interface (SPI).

9. The integrated circuit current sensor of claim 1 further comprising a gain storage device, wherein the calibrated gain is stored in the gain storage device.

10. The integrated circuit current sensor of claim 9 wherein the gain storage device is selected from an EEPROM and a fuse network.

11. The integrated circuit current sensor of claim 1 wherein the controllable gain stage comprises an adjustable reference voltage and wherein the calibration controller is responsive to a calibration command signal for adjusting the adjustable reference voltage to provide the amplified magnetic field signal at a predetermined voltage level corresponding to a calibration current of zero amps.

12. The integrated circuit current sensor of claim 11 wherein the calibration controller further comprises:
a comparator having a first input responsive to an adjustable quiescent voltage output voltage ($V_{QVO}$) reference voltage indicative of the predetermined voltage level corresponding to the calibration current when the calibration current is zero amps, a second input responsive to the amplified magnetic field signal, and an output at which a comparator output signal is provided in a first state when the amplified magnetic field signal is less than the predetermined voltage level and in a second state when the amplified magnetic field signal is greater than the predetermined voltage level; and
a counter that is responsive to the calibration command signal to start counting, responsive to the comparator output signal to stop counting, and that provides a counter output signal to the controllable gain stage to adjust the adjustable reference voltage.

13. The integrated circuit current sensor of claim 12 wherein the adjustable $V_{QVO}$ reference voltage is determined by the calibration command signal.

14. The integrated circuit current sensor of claim 13 wherein the calibration controller further comprises a resistive voltage divider configured to provide the ($V_{QVO}$) reference voltage, wherein the resistive voltage divider has a variable resistance and a fixed resistance and wherein variable resistance is determined by the calibration command signal.

15. The integrated circuit current sensor of claim 12 wherein the controllable gain stage further comprises a resistive voltage divider configured to provide the adjustable reference voltage, wherein the resistive voltage divider has a variable resistance and a fixed resistance and wherein variable resistance is controlled by the counter output signal.

16. The integrated circuit current sensor of claim 1 wherein the magnetic field transducer, the calibration controller and the controllable gain stage are provided in an integrated circuit.

17. The integrated circuit current sensor of claim 1 wherein the controllable gain stage comprises an adjustable reference voltage and the calibration controller is responsive to a second calibration control signal to control the adjustable reference voltage.

18. The integrated circuit sensor of claim 1 further comprising a package including a lead frame having a lead frame portion that forms the integrated current conductor.

19. A method of self-calibration by a current sensor having an integrated current conductor when coupled in parallel with an external shunt conductor in a current divider configuration, comprising:
sensing a magnetic field generated by a portion of a calibration current that is provided at a full scale current level to the current divider configuration, the calibration current portion being carried through the integrated current conductor, with a magnetic field transducer positioned in proximity to the integrated current conductor to provide a magnetic field signal having a voltage level proportional to the magnetic field;
amplifying the magnetic field signal with an adjustable gain to provide an amplified magnetic field signal; and
adjusting the adjustable gain to a calibrated gain in order to provide the amplified magnetic field signal at a predetermined voltage level associated with the calibration current when the calibration current is provided at a full scale current level.

20. The method of claim 19 further comprising:
- sensing a magnetic field generated by the calibration current portion when the calibration current is provided at a current level of zero amps, to provide a magnetic field signal having a voltage level proportional to the magnetic field;
- amplifying the magnetic field signal with the calibrated gain to provide an amplified magnetic field signal; and
- adjusting an adjustable reference voltage to provide the amplified magnetic field signal at a predetermined voltage level associated with the calibration current when the calibration current is provided at a current level of zero amps.

* * * * *

UNITED STATES PATENT AND TRADEMARK OFFICE
CERTIFICATE OF CORRECTION

PATENT NO. : 8,604,777 B2  
APPLICATION NO. : 13/181926  
DATED : December 10, 2013  
INVENTOR(S) : Michael C. Doogue et al.

It is certified that error appears in the above-identified patent and that said Letters Patent is hereby corrected as shown below:

In the specification

Column 8, Line 6 delete "input the veal control" and replace with --input the Vcal control--.

Column 9, Line 60 delete "signal veal goes" and replace with --signal Vcal goes--.

Column 10, Line 11 delete "52, 10 Gauss" and replace with --52, 10Gauss--.

Column 10, Line 15 delete "(3V-1.65V)/20 A/10 G/A" and replace with --(3V-1.65V)/20A/10G/A--.

Column 10, Line 17 delete "at 10 A through" and replace with --at 10A through--.

Column 10, Line 18 delete "and 10 A through" and replace with --and 10A through--.

Column 10, Line 21 delete "or (3-1.65)V/10 A/10 G/A, or 135" and replace with --or (3-1.65)V/10A/10/G/A, or 135--.

Column 10, Line 25 delete "perfect 10 A split" and replace with --perfect 10A split--.

Column 10, Line 62 delete "the 20 Amp" and replace with --the 20 Amp--.

Column 10, Line 64 delete "than 5 A in" and replace with --than 5A in--.

Column 10, Line 64 delete "than 15 A provided" and replace with --than 15A provided--.

Column 10, Line 65 delete "300 mV/A" and replace with --300mV/A--.

Column 10, Line 66 delete "split of 5 A/20 A" and replace with --split of 5A/20A--.

Column 11, Line 52 delete "system to 0 A and" and replace with --system to 0A and--.

Signed and Sealed this  
Twenty-ninth Day of December, 2015

Michelle K. Lee  
*Director of the United States Patent and Trademark Office*